US009673352B2

(12) United States Patent
Chang et al.

(10) Patent No.: US 9,673,352 B2
(45) Date of Patent: Jun. 6, 2017

(54) SEMICONDUCTOR LIGHT EMITTING DEVICE

(71) Applicant: National Chiao Tung University, Hsinchu (TW)

(72) Inventors: Chun-Yen Chang, Hsinchu (TW); Zhen-Yu Li, Hsinchu (TW); Hao-Chung Kuo, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 14/700,633

(22) Filed: Apr. 30, 2015

(65) Prior Publication Data

US 2016/0322533 A1    Nov. 3, 2016

(51) Int. Cl.

| H01L 33/06 | (2010.01) |
|---|---|
| H01L 33/32 | (2010.01) |
| H01L 33/00 | (2010.01) |
| H01L 33/14 | (2010.01) |
| H01L 33/04 | (2010.01) |

(52) U.S. Cl.
CPC .......... *H01L 33/06* (2013.01); *H01L 33/0025* (2013.01); *H01L 33/04* (2013.01); *H01L 33/145* (2013.01); *H01L 33/32* (2013.01)

(58) Field of Classification Search
None
See application file for complete search history.

(56) References Cited

U.S. PATENT DOCUMENTS

| 2008/0054247 A1* | 3/2008 | Eichler ............... H01S 5/34333 257/13 |
| 2010/0133506 A1* | 6/2010 | Nakanishi ............. B82Y 20/00 257/13 |
| 2011/0101304 A1* | 5/2011 | Song .................. H01L 33/0079 257/13 |
| 2012/0049156 A1* | 3/2012 | Ohta ................... H01L 21/0237 257/13 |
| 2012/0217469 A1* | 8/2012 | Wang .................... H01L 33/04 257/13 |
| 2013/0022064 A1* | 1/2013 | Raring ............... H01S 5/34333 372/29.013 |

(Continued)

OTHER PUBLICATIONS

Li et al., "High-Efficiency and Crack-Free InGaN-Based LEDs on a 6-inch Si (111) Substrate With a Composite Buffer Layer Structure and Quaternary Superlattices Electron-Blocking Layers", "Journal of Quantum Electronics", May 2014, pp. 354-363, vol. 50, No. 5, IEEE.

*Primary Examiner* — William Coleman
*Assistant Examiner* — Kien Ly

(57) ABSTRACT

A light emitting device is provided. The light emitting device includes a substrate, an N type semiconductor layer formed on the substrate, an active layer, an electron-blocking layer, and a P type semiconductor layer formed on the electron-blocking layer. An N side electrode is formed on a first portion of the N type semiconductor layer, and the active layer is formed on a second portion of the N type semiconductor layer. The electron-blocking layer is a super lattice multi-layer structure formed on the active layer, the P type semiconductor layer is formed on the electron-blocking layer, and a P side electrode is formed on a portion of the P type semiconductor layer.

5 Claims, 6 Drawing Sheets

(56) References Cited

U.S. PATENT DOCUMENTS

| | | | | |
|---|---|---|---|---|
| 2013/0069034 A1* | 3/2013 | Hirayama | ............... | H01L 33/04 257/13 |
| 2013/0146842 A1* | 6/2013 | Kim | ....................... | H01L 33/06 257/13 |
| 2013/0256687 A1* | 10/2013 | Saito | ....................... | H01L 33/32 257/76 |
| 2014/0034903 A1* | 2/2014 | Won | ....................... | H01L 33/06 257/13 |
| 2014/0124734 A1* | 5/2014 | Lin | ................... | H01L 21/0237 257/13 |
| 2015/0287876 A1* | 10/2015 | Han | ....................... | H01L 33/06 257/13 |

* cited by examiner

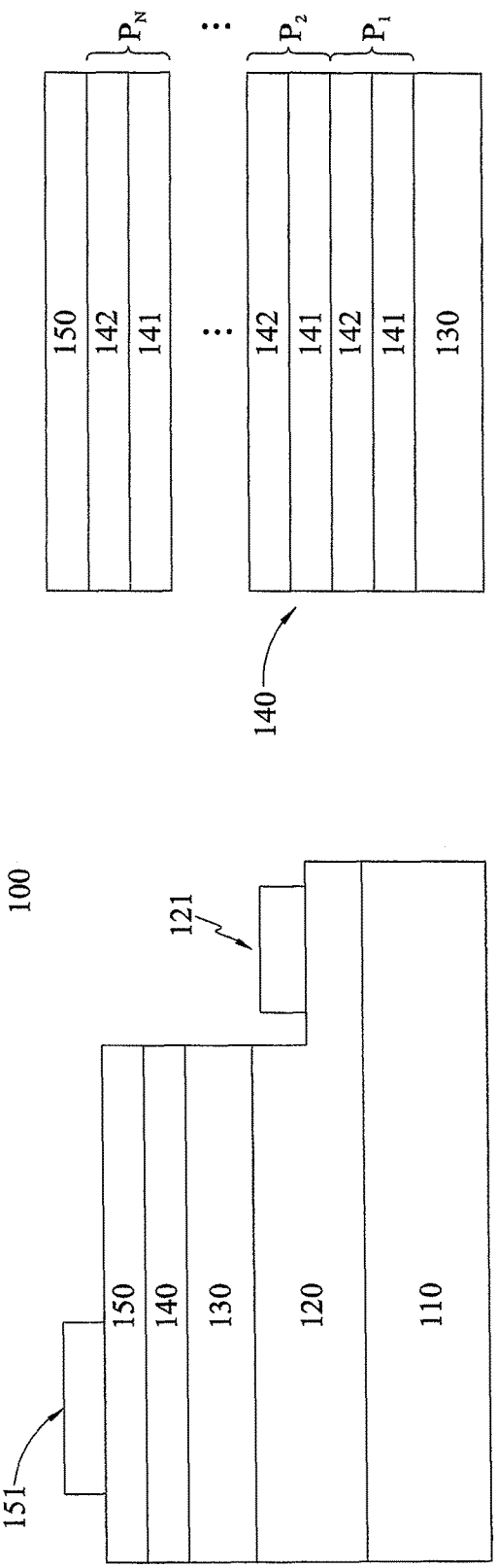

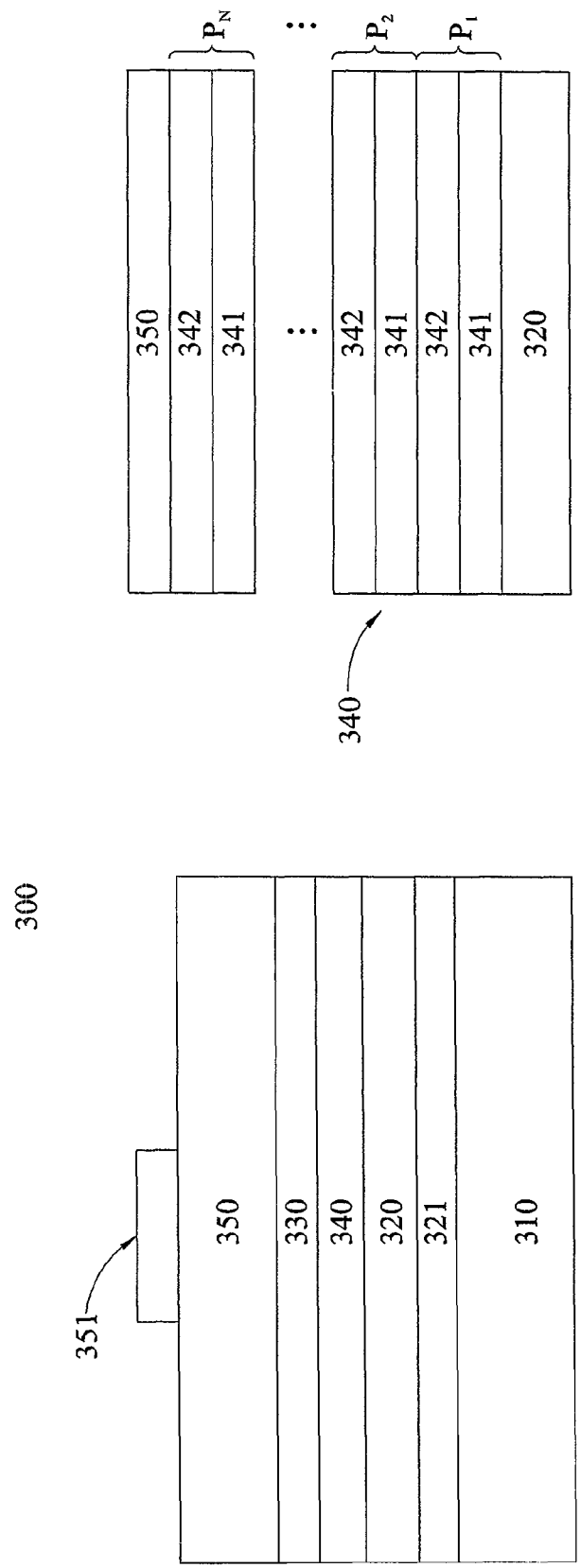

SEMICONDUCTOR LIGHT EMITTING DEVICE

FIELD OF THE INVENTION

The invention relates to a semiconductor light emitting device, and, more particularly, to a semiconductor light emitting device with improved electron-blocking layer.

DESCRIPTION OF RELATED ART

In the structure of conventional wide-bandgap semiconductor light emitting device (especially for those with group III-V nitrides), aluminum-containing materials are usually interposed in an electron-blocking layer to effectively reduce electron leakage current. However, although the electron-blocking layer containing aluminum may reduce the electron leakage current, which also influence the injection of holes into an active layer. For example, the electron-blocking layer containing aluminum may form an energy barrier at the valence band, such that it is more difficult to inject the holes into the active layer. This may reduce the carrier injection efficiency of the semiconductor light emitting device, and lead an issue of poor light emitting efficiency.

Moreover, since the electron-blocking layer containing aluminum such as AlGaN has a lattice constant different to GaN, lattice mismatch may occur. This limits the enhancement of crystal quality, and thus an electron-blocking layer with high crystal quality can hardly to be obtained.

From the foregoing, how to provide a semiconductor light emitting device with improved electron-blocking layer to solve the electron leakage current and the low holes injection efficiency problems meanwhile enhancing the crystal quality of the electron-blocking layer is an issue desired to be solved.

SUMMARY OF THE INVENTION

Given abovementioned defects of the prior art, the present invention provides a semiconductor light emitting device with improved electron-blocking layer.

The improved electron-blocking layer according to the present invention is a super lattice multi-layer structure constructed by a first layer of quaternary material AlInGaN alternately stacked with a second layer of AlGaN material. The improved electron-blocking layer can not only change the bandgap of the electron-blocking layer to effectively reduce the electron leakage current, but also facilitate reducing the energy barrier at the valence band to enhance the holes injection efficient, so as to reduce the operating voltage.

In addition, the quaternary material AlInGaN and the GaN material of the active layer are lattice matched, such that the crystal quality can be significantly improved.

BRIEF DESCRIPTION OF DRAWINGS

The present invention can be more fully understood by reading the following detailed description of the preferred embodiments, with reference made to the accompanying drawings, wherein:

FIG. 1 is a scheme view of a semiconductor light emitting device having an electron-blocking layer according to an embodiment of the present invention;

FIG. 2 is a schematic view of the electron-blocking layer illustrated in FIG. 1;

FIG. 3 is a scheme view of a semiconductor light emitting device having an electron-blocking layer according to an embodiment of the present invention;

FIG. 4 is a schematic view of the electron-blocking layer illustrated in FIG. 3;

DETAILED DESCRIPTION OF PREFERRED EMBODIMENTS

Figures 5A, 5B:
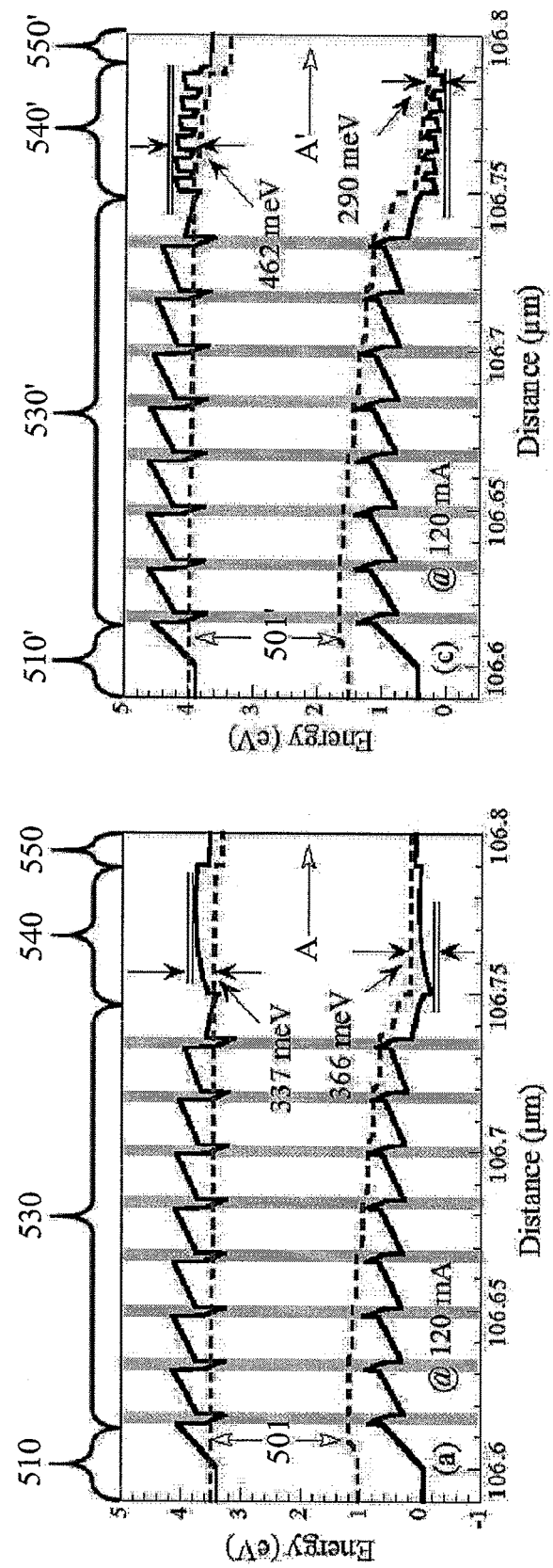
FIGS. 5A and 5B are comparison charts for bands of a semiconductor light emitting device according to conventional art and a semiconductor light emitting device according to an embodiment of the present invention.

In the following, specific embodiments are provided to illustrate the detailed description of the present invention. Those skilled in the art can easily conceive the other advantages and effects of the present invention, based on the disclosure of the specification. The present invention can also be carried out or applied by other different embodiments.

FIG. 1 is a scheme view of a semiconductor light emitting device 100 having an electron-blocking layer 140 according to an embodiment of the present invention. The light emitting device 100 includes a substrate 110, an N type semiconductor layer 120 formed on the substrate 110, an active layer 130, an electron-blocking layer 140, and a P type semiconductor layer 150 formed on the electron-blocking layer 140.

As shown in FIG. 1, an N side electrode 121 is formed on a first portion of the N type semiconductor layer 120, and the active layer 130 is formed on a second portion of the N type semiconductor layer 120. The electron-blocking layer 140 is formed on the active layer 130, and the P type semiconductor layer 150 is formed on the electron-blocking layer. Also, a P side electrode 151 is formed on a portion of the P type semiconductor layer 150.

In an embodiment, the electron-blocking layer 140 is a super lattice multi-layer structure that includes a first layer of $Al_xIn_xGa_{1-x-y}N$ ($0 \leq x, y \leq 1$) and a second layer of $Al_zGa_{1-z}N$ ($0 \leq z \leq 1$), where the first layer is alternately stacked with the second layer. In an embodiment, as illustrated in FIG. 2, the electron-blocking layer 140 includes N pairs of the first layer 141 and the second layer 142, and each pair (P$_1$, P$_2$ ..., P$_N$) of the first layer 141 and the second layer 142 has a thickness of 2 nanometer. Preferably, a total thickness of the electron-blocking layer 140 is between 2 and 100 nanometer, and more preferably, the total thickness of the electron-blocking layer 140 is 50 nanometer. It should be noted, that although a stacking of the electron-blocking layer 140 illustrated in FIG. 2 begins from a first layer 141, i.e., the first layer 141 is formed on the active layer 130, the stacking of the electron-blocking layer 140 can also begin from a second layer 142. In other words, the first layer 141 is not limited to be formed on the active layer 130. In an embodiment, the second layer 142 can be formed on the active layer 130 first, and then the first layer 141 is alternately stacked on the second layer 142.

In an embodiment, the second layers 142 of the N pairs of the first layer 141 and the second layer 142 are sequentially constructed by Al$_z$Ga$_{1-z}$N with a reducing quantity of Al through a decrement determined by N. For example, the z of each of the second layers 142 along a direction from the active layer 130 to the P type semiconductor layer 150 is sequentially reduced from 0.5 to 0 with a decrement such as 0.05. In other words, the z of the second layer 142 of the first pair P$_1$ is 0.5, the z of the second layer 142 of the second pair P$_2$ is 0.45, and so on. In an embodiment, the z of each of the second layers 142 along a direction from the active layer 130 to the P type semiconductor layer 150 is sequentially reduced from 0.3 to 0.

Alternately, the second layers 142 of the N pairs of the first layer 141 and the second layer 142 are sequentially constructed by Al$_z$Ga$_{1-z}$N with an increasing quantity of Al through an increment determined by N. For example, the z of each of the second layers 142 along a direction from the active layer 130 to the P type semiconductor layer 150 is sequentially increased from 0 to 0.5 with an increment such as 0.05. In other words, the z of the second layer 142 of the first pair P$_1$ is 0, the z of the second layer 142 of the second pair P$_2$ is 0.05, and so on. In an embodiment, the z of each of the second layers 142 along a direction from the active layer 130 to the P type semiconductor layer 150 is sequentially increased from 0 to 0.3.

Therefore, the lattice constants between the active layer 130 and the electron-blocking layer 140 can be better matched. Preferably, the number N of pairs of the first layer 141 and the second layer 142 is an integer in a range from 8 to 10.

Moreover, in an embodiment, the active layer 130 is constructed by InGaN/GaN material. In addition, in an embodiment, the substrate 110 is a material selected from a group consisting of sapphire, SiC, ZnO, Si, GaN and Ga$_2$O$_3$.

FIG. 3 is a scheme view of a semiconductor light emitting device 300 having an electron-blocking layer 340 according to an embodiment of the present invention. The light emitting device 300 includes a substrate 310, a P type semiconductor layer 320 formed above the substrate 310 with a P side electrode 321 formed between the substrate 310 and the P type semiconductor layer 320, an electron-blocking layer 340 formed on the P type semiconductor layer 320, an active layer 330 formed on the electron-blocking layer 340, and an N type semiconductor layer 350 formed on the active layer 330.

As shown in FIG. 3, an N side electrode 351 is further formed on a portion of the N type semiconductor layer 350.

In an embodiment, the electron-blocking layer 340 is a super lattice multi-layer structure that includes a first layer of Al$_x$In$_x$Ga$_{1-x-y}$N (0≤x,y≤1) and a second layer of Al$_z$Ga$_{1-z}$N (0≤z≤1), where the first layer is alternately stacked with the second layer. In an embodiment, as illustrated in FIG. 4, the electron-blocking layer 340 includes N pairs of the first layer 341 and the second layer 342, and each pair (P$_1$, P$_2$ ..., P$_N$) of the first layer 341 and the second layer 342 has a thickness of 2 nanometers. Preferably, a total thickness of the electron-blocking layer 340 is between 2 and 100 nanometer, and more preferably, the total thickness of the electron-blocking layer 340 is 50 nanometers. It should be noted, that although a stacking of the electron-blocking layer 340 illustrated in FIG. 4 begins from a first layer 341, i.e., the first layer 341 is formed on the P type semiconductor layer 320, the stacking of the electron-blocking layer 340 can also begin from a second layer 342. In other words, the first layer 341 is not limited to be formed on the P type semiconductor layer 320. In an embodiment, the second layer 342 can be formed on the P type semiconductor layer 320 first, and then the first layer 341 is alternately stacked on the second layer 342.

In an embodiment, the second layers 342 of the N pairs of the first layer 341 and the second layer 342 are sequentially constructed by Al$_z$Ga$_{1-z}$N with an increasing quantity of Al through an increment determined by N. For example, the z of each of the second layers 342 along a direction from the P type semiconductor layer 320 to the active layer 330 active layer 330 is sequentially increased from 0 to 0.5 with an increment such as 0.05. In other words, the z of the second layer 342 of the first pair P$_1$ is 0, the z of the second layer 342 of the second pair P$_2$ is 0.05, and so on. In an embodiment, the z of each of the second layers 342 along a direction from the P type semiconductor layer 320 to the active layer 330 active layer 330 is sequentially increased from 0 to 0.3.

Alternatively, the second layers 342 of the N pairs of the first layer 341 and the second layer 342 can be sequentially constructed by Al$_z$Ga$_{1-z}$N with a reducing quantity of Al through a decrement determined by N. For example, the z of each of the second layers 342 along a direction from the P type semiconductor layer 320 to the active layer 330 active layer 330 is sequentially reduced from 0.5 to 0 with a decrement such as 0.05. In other words, the z of the second 0.5 to 0 with a decrement such as 0.05. layer 342 of the first pair P$_1$ is 0.5, the z of the second layer 342 of the second pair P$_2$ is 0.45, and so on. In an embodiment, the z of each of the second layers 342 along a direction from the P type semiconductor layer 320 to the active layer 330 active layer 330 is sequentially reduced from 0.3 to 0.

Therefore, the lattice constants between the active layer 330 and the electron-blocking layer 340 can be better matched. Preferably, the number N of pairs of the first layer 341 and the second layer 342 is an integer in a range from 8 to 10.

Moreover, in an embodiment, the active layer 330 is constructed by InGaN/GaN material. In addition, in an embodiment, the substrate 310 is a material selected from a group consisting of sapphire, SiC, ZnO, Si, GaN and Ga$_2$O$_3$.

FIGS. 5A and 5B are comparison charts of energy over distance of a semiconductor light emitting device according to conventional art and the semiconductor light emitting device 100 according to an embodiment of the present invention, where the distance begins from the N type semiconductor layer 510, 510', the active layer 530, 530', the electron-blocking layer 540, 540', and the P type semiconductor layer 550, 550'.

As shown in FIGS. 5A and 5B, dashed lines 501, 501' present the quasi-Fermi levels of electron and hole at a current of 120 mA in FIG. 5A and FIG. 5B, respectively, and the arrow A, A' indicates the P side of the semiconductor light emitting device. It can be seen that the electron energy barrier of the semiconductor light emitting device according to the present invention is increased to about 462 meV, and the hole energy barrier of the semiconductor light emitting device according to the present invention is reduced to about 290 meV.

Figure 6:
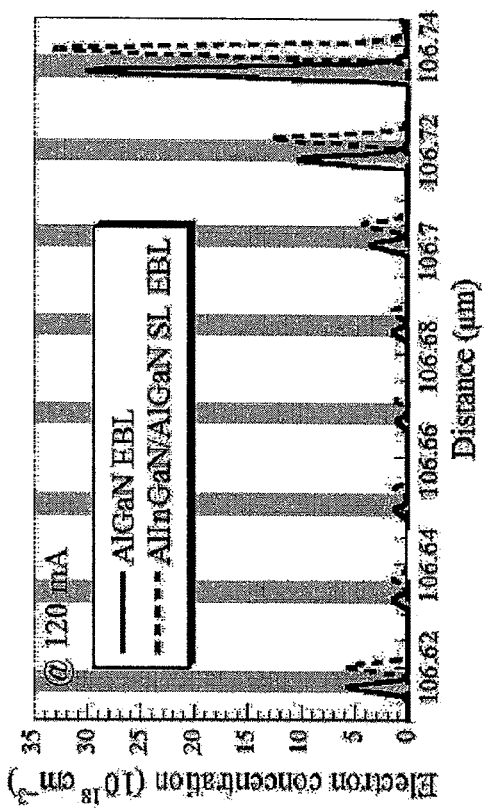
FIG. 6 is a comparison chart of electron concentration over distance between a semiconductor light emitting device according to the conventional art and a semiconductor light emitting device according to an embodiment of the present invention.

FIG. 6 is a comparison chart of electron concentration over distance at a current of 120 mA between a semiconductor light emitting device according to the conventional art and the semiconductor light emitting device 100 according to an embodiment of the present invention.

Figure 7:
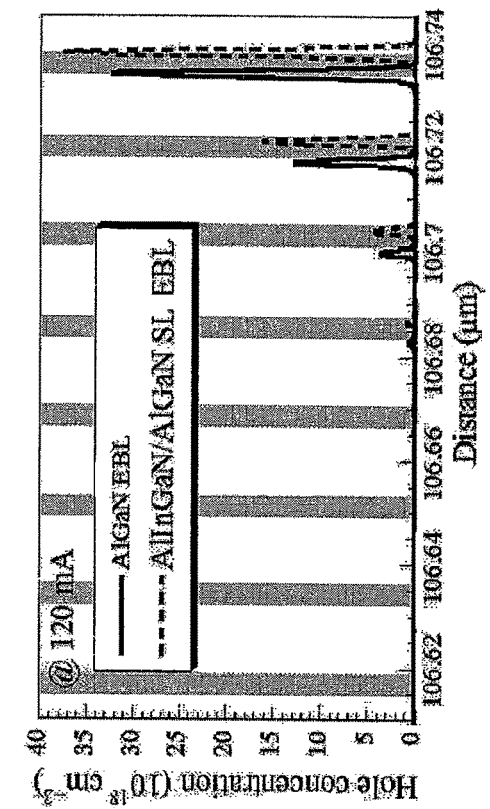
FIG. 7 is a comparison chart of hole concentration over distance between a semiconductor light emitting device according to the conventional art and a semiconductor light emitting device according to an embodiment of the present invention.

FIG. 7 is a comparison chart of hole concentration over distance at a current of 120 mA between a semiconductor light emitting device according to the conventional art and the semiconductor light emitting device 100 according to an embodiment of the present invention.

As shown in FIGS. 6 and 7, it can be seen that the electron concentration and the hole concentration of the semiconductor light emitting device 100 according to an embodiment of the present invention are both higher than the semiconductor light emitting device according to the conventional art.

Figures 8, 9:
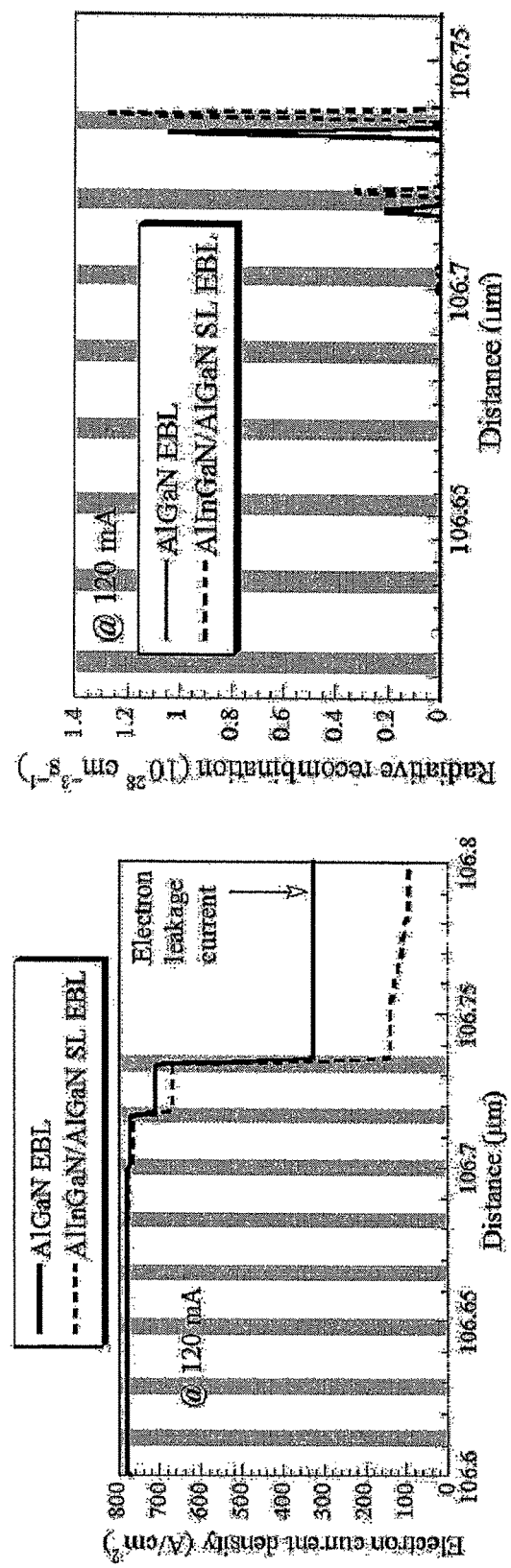
FIG. 8 is a comparison chart of electron current density over distance between a semiconductor light emitting device according to the conventional art and a semiconductor light emitting device according to an embodiment of the present invention.
FIG. 9 is a comparison chart of radiative recombination over distance between a semiconductor light emitting device according to the conventional art and a semiconductor light emitting device according to an embodiment of the present invention.

FIG. 8 is a comparison chart of electron current density over distance at a current of 120 mA between a semiconductor light emitting device according to the conventional art and the semiconductor light emitting device 100 according to an embodiment of the present invention. It can be seen that the semiconductor light emitting device 100 has a lower carrier leakage owing to a weaker polarization effects.

FIG. 9 is a comparison chart of radiative recombination over distance at a current of 120 mA between a semiconductor light emitting device according to the conventional art and the semiconductor light emitting device 100 according to an embodiment of the present invention. It can be seen that the semiconductor light emitting device 100 provides an increased radiative recombination rate in a multiple quantum well region of the electron-blocking layer.

Figure 10:
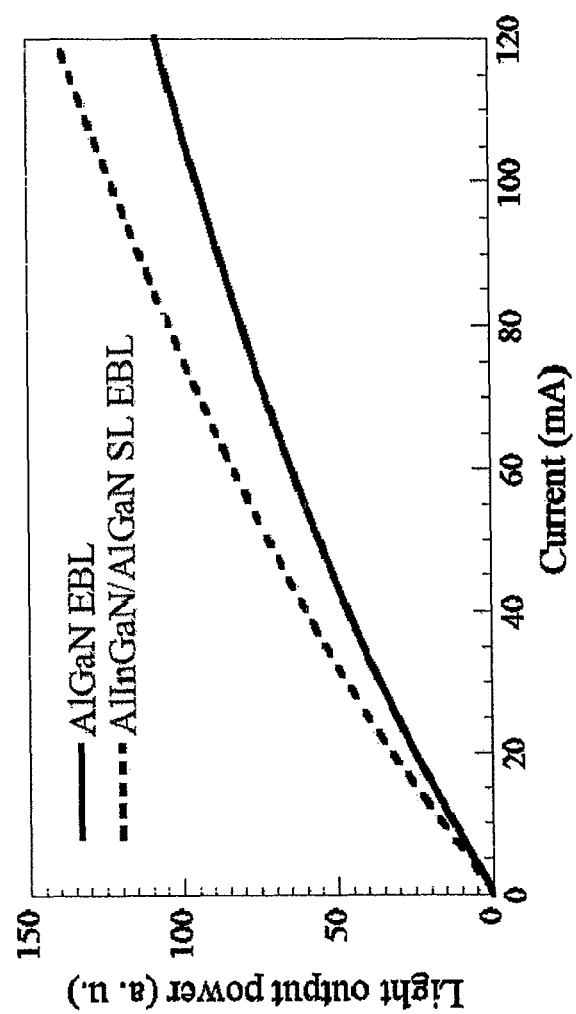
FIG. 10 is a comparison chart of light output power over current between a semiconductor light emitting device according to the conventional art and a semiconductor light emitting device according to an embodiment of the present invention.

FIG. 10 is a comparison chart of light output power over current between a semiconductor light emitting device according to the conventional art and the semiconductor light emitting device 100 according to an embodiment of the present invention. It can be seen that as the semiconductor light emitting device 100 provides an increased radiative recombination rate, the light output power of the semiconductor light emitting device 100 also rise.

From the foregoing, the present invention provides a super lattice multi-layer structure constructed by a first layer of quaternary material AlInGaN alternately stacked with a second layer of AlGaN material. The improved electron-blocking layer can not only change the bandgap of the electron-blocking layer to effectively reduce the electron leakage current, but also facilitate reducing the energy barrier at the valence band to enhance the holes injection efficient, so as to reduce the operating voltage. In addition, the quaternary material AlInGaN and the GaN material of the active layer are lattice matched, such that the crystal quality can be significantly improved.

The above examples are only used to illustrate the principle of the present invention and the effect thereof, and should not be construed as to limit the present invention. The above examples can all be modified and altered by those skilled in the art, without departing from the spirit and scope of the present invention as defined in the following appended claims.

What is claimed is:

1. A semiconductor light emitting device, comprising:
   a substrate;
   a P type semiconductor layer formed on the substrate;
   a P side electrode formed between the substrate and the P type semiconductor layer;
   an electron-blocking layer formed on the P type semiconductor layer, wherein the electron-blocking layer is a super lattice multi-layer structure;
   an active layer formed on the electron-blocking layer, wherein the active layer is constructed by InGaN/GaN material;
   an N type semiconductor layer formed on the active layer; and
   an N side electrode formed on the N type semiconductor layer,
   wherein the super lattice multi-layer structure comprises a first layer of $Al_xIn_xGa_{1-x-y}N$ ($0<x<1$, $0<y<1$, $0\leq 1-x-y$) alternately stacked with a second layer of $Al_zGa_{1-z}N$ ($0\leq z\leq 1$),
   wherein the super lattice multi-layer structure comprises N pairs of the first layer and the second layer, and N is an integer in a range from 8 to 10,
   wherein the second layers of the N pairs of the first and the second layer are sequentially constructed by $Al_zGa_{1-z}N$ with a reducing quantity of Al, where z of each of the second layers along a direction from the active layer to the P type semiconductor layer is sequentially reduced from 0.5 to 0, or the second layers of the N pairs of the first and the second layer are sequentially constructed by $Al_zGa_{1-z}N$ with an increasing quantity of Al, where z of each of the second layers along a direction from the active layer to the P type semiconductor layer is sequentially increased from 0 to 0.5.

2. The semiconductor light emitting device of claim 1, wherein the substrate has a material of sapphire, SiC, ZnO, Si, GaN or $Ga_2O_3$.

3. The semiconductor light emitting device of claim 1, wherein each pair of the first layer and the second layer has a thickness of 2 nanometers.

4. The semiconductor light emitting device of claim 3, wherein a total thickness of the electron-blocking layer is between 2 and 100 nanometers.

5. The semiconductor light emitting device of claim 4, wherein the total thickness of the electron-blocking layer is 50 nanometers.

* * * * *

UNITED STATES PATENT AND TRADEMARK OFFICE
CERTIFICATE OF CORRECTION

PATENT NO. : 9,673,352 B2  Page 1 of 1
APPLICATION NO. : 14/700633
DATED : June 6, 2017
INVENTOR(S) : Chang et al.

It is certified that error appears in the above-identified patent and that said Letters Patent is hereby corrected as shown below:

In the Specification

Column 4, Lines 38-39:
Delete "In other words, the z of the second 0.5 to 0 with a decrement such as 0.05. layer 342"
and insert therefor --In other words, the z of the second layer 342--

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*